US012731964B2

(12) United States Patent
Siriani et al.

(10) Patent No.: US 12,731,964 B2
(45) Date of Patent: Sep. 8, 2026

(54) INVERTED SLAB-COUPLED OPTICAL WAVEGUIDE

(71) Applicant: Cisco Technology, Inc., San Jose, CA (US)

(72) Inventors: Dominic F. Siriani, Lansdale, PA (US); Kenneth J. Thomson, San Francisco, CA (US)

(73) Assignee: Cisco Technology, Inc., San Jose, CA (US)

(*) Notice: Subject to any disclaimer, the term of this patent is extended or adjusted under 35 U.S.C. 154(b) by 1141 days.

(21) Appl. No.: 17/658,769

(22) Filed: Apr. 11, 2022

(65) Prior Publication Data

US 2023/0327404 A1 Oct. 12, 2023

(51) Int. Cl.
*H01S 5/22* (2006.01)
*H01S 5/20* (2006.01)

(52) U.S. Cl.
CPC .............. *H01S 5/22* (2013.01); *H01S 5/2031* (2013.01); *H01S 5/2206* (2013.01)

(58) Field of Classification Search
CPC ........ G02B 6/1228; G02B 2006/12097; H01S 5/2206; H01S 5/2031
See application file for complete search history.

(56) References Cited

U.S. PATENT DOCUMENTS 5,048,907 A 9/1991 Wickman et al.
5,138,687 A * 8/1992 Horie .................. G02B 6/1245 385/129
2002/0051615 A1* 5/2002 Walpole .................. H01S 5/223 359/344
2006/0078025 A1* 4/2006 Itonaga ..................... H01S 5/22 372/45.01
2011/0128982 A1* 6/2011 Huang .................. H01S 5/2031 372/45.01
2013/0294472 A1 11/2013 Feng et al.
2018/0059504 A1* 3/2018 Mekis ....................... G02F 1/21
2018/0278021 A1 9/2018 Ferrotti et al.
2018/0348430 A1 12/2018 Ogawa
2020/0220329 A1* 7/2020 Siriani .................... H01S 5/021
(Continued)

FOREIGN PATENT DOCUMENTS

CN 1976145 A * 6/2007 ............... H01S 5/22
DE 60222724 T2 * 7/2008 ........... H01S 5/2231
(Continued)

OTHER PUBLICATIONS

TW_471065_B1 (English translation) (Year: 2002).*
(Continued)

*Primary Examiner* — Thomas A Hollweg
*Assistant Examiner* — Mary A El-Shammaa
(74) *Attorney, Agent, or Firm* — Patterson + Sheridan, LLP

(57) ABSTRACT

The structures and methods described include an inverted slab-coupled optical waveguide (SCOW) structure, which inverts the polarity of a typical SCOW diode and includes an active region located at an inverted side of the slab section of the inverted SCOW. The inverted SCOWs provide for easily adjustable optical mode confinement or overlap in an active region/gain medium without the risks of generating multiple spatial modes or high electrical resistance associated with traditional non-inverted SCOWs.

20 Claims, 9 Drawing Sheets

(56) References Cited

U.S. PATENT DOCUMENTS

| | | | | |
|---|---|---|---|---|
| 2020/0280171 | A1* | 9/2020 | Siriani | G02B 6/1228 |
| 2020/0313390 | A1* | 10/2020 | Siriani | H01S 5/22 |
| 2020/0381887 | A1 | 12/2020 | Watanabe et al. | |

FOREIGN PATENT DOCUMENTS

| | | | | | |
|---|---|---|---|---|---|
| TW | I259296 | B | * | 8/2006 | G02B 6/1228 |
| TW | 471065 | B1 | * | 1/2015 | H02M 3/155 |
| WO | WO-2015151597 | A1 | * | 10/2015 | G02B 6/122 |

OTHER PUBLICATIONS

WO_2015151597_A1 (English translation) (Year: 2015).*

CN_1976145_A (English translation) (Year: 2007).*

DE_60222724_T2 (English translation) (Year: 2008).*

TW_I259296_B (English translation) (Year: 2006).*

Original SCOWL—Juodawlkis et al., "High-power, low-noise 1.5-um slab-coupled optical waveguide (SCOW) emitters: physics, devices, and applications," IEEE J. Sel. Top. Quant. Electr., 17, 1698, 2011. [Abstract Only].

Super Large Optical Cavity—Pietrzak et al., "Combination of low-index quantum barrier and super large optical cavity designs for ultranarrow vertical far-fields from high-power broad area lasers," IEEE J. Sel. Top. Quant. Electr., 17, 1715, 2011. [Abstract Only].

Far-Field Reduction Layer—Qiu et al., "Design and fabrication of low beam divergence and high kink-free power lasers," IEEE J. Quant. Electr., 41, 1124, 2005. [Abstract Only].

Photonic Bandgap Crystal & High-Brightness Broad Area Edge-Emitting Lasers—Maximov et al., "High-performance 640-nm-range GalnP-AlGalnP lasers based on the longitudinal photonic bandgap crystal with narrow vertical beam divergence," IEEE J. Quant. Electr., 41, 1341, 2005.; Miah et al., "Astigmatism-free high-brightness 1060 nm edge-emitting lasers with narrow circular beam profile," Opt. Exp., 24, 30514, 2016. [Abstract Only].

Zhao et al., High-Power Indium Phosphide Photonic Integrated Circuits, IEEE J. of Selected Topics in Quantum Elec., vol. 25, No. 6, Nov./Dec. 2019.

Miah et al., "Astigmatism-free high-brightness 1060 nm edge-emitting lasers with narrow circular beam profile," Opt. Exp., 24, 30514, 2016.

Duggan et al., "Development of inverted p-substrate InP/AlGalnAs lasers for vertical integration with multiple passive or active intrinsic regions," Proceedings of the European Conference on Integrated Optics 2017, Eindhoven, the Netherlands, Apr. 3-5.

* cited by examiner

INVERTED SLAB-COUPLED OPTICAL WAVEGUIDE

TECHNICAL FIELD

Embodiments presented in this disclosure generally relate to the generation of optical signals and their transmission into silicon (Si) photonic platforms. More specifically, embodiments described herein relate to an inverted slab-coupled optical waveguide that provides a flexible optical spot size for optical coupling into a fiber or silicon photonic circuit as well as efficient propagation and coupling of optical signals between active and passive regions of the slab-coupled waveguide structure.

BACKGROUND

Evolving applications for semiconductor lasers and amplifiers, such as silicon photonics for optical communications, continue to drive the need for higher optical output powers. However, designs that support high optical powers typically differ from designs suited for low powers.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
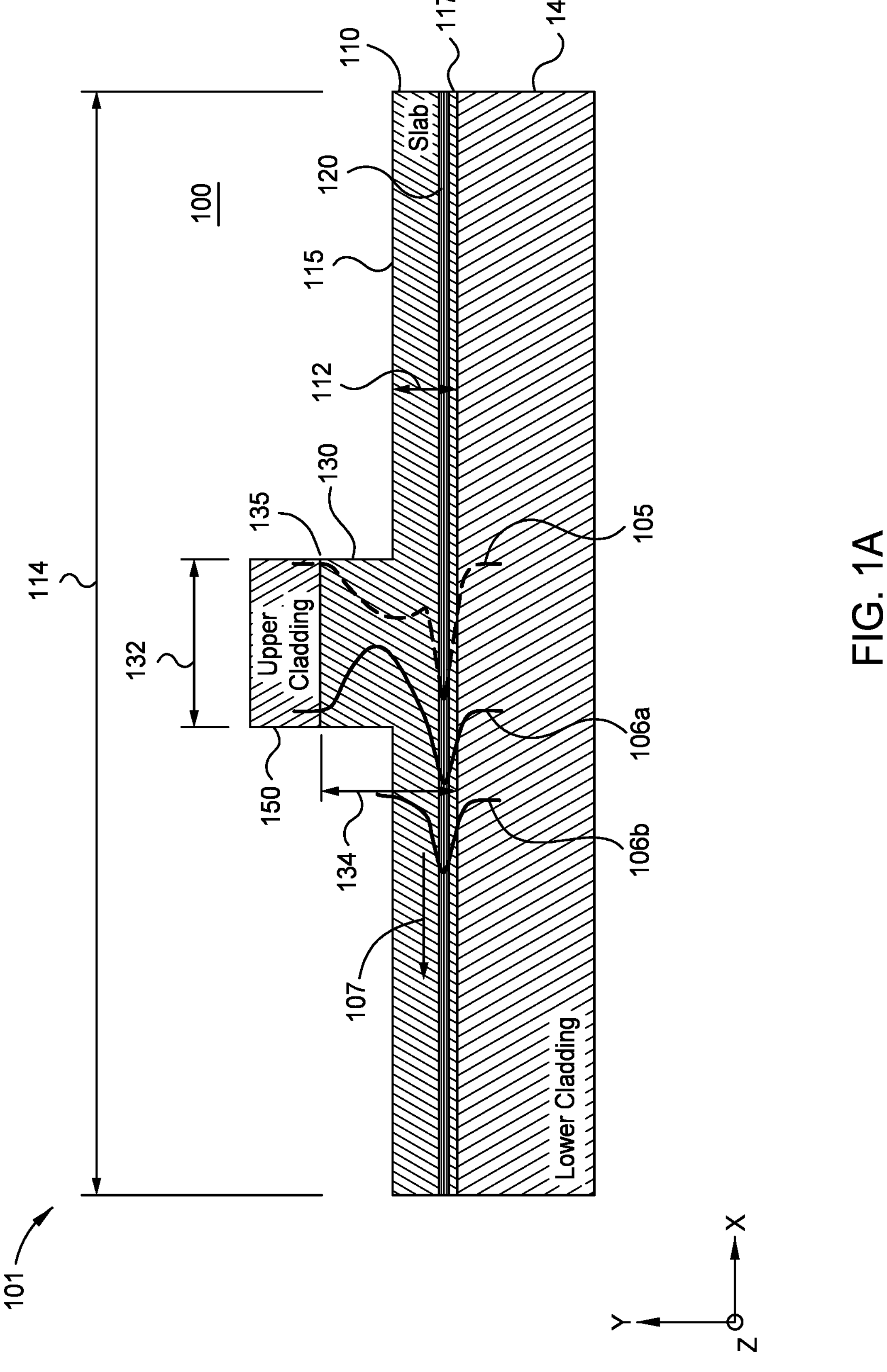
FIG. 1A illustrates a cross-section of an inverted slab-coupled optical waveguide, according to an embodiment described herein.

One example embodiment is an optical waveguide. The optical waveguide includes a slab section with a slab width in a first direction. The waveguide also includes a rib section formed on a first side of the slab section, where the rib section includes a rib width in the first direction that is less than the slab width, and where the rib section includes a rib height in a second direction perpendicular to the first direction. The waveguide also includes an active region positioned in the slab section. The waveguide also includes a p-cladding layer positioned on a second side of the slab section opposite to the rib section. The waveguide also includes an n-cladding layer on a first side of the rib section opposite to the slab section.

One general aspect includes a method. The method includes transmitting an optical signal in a first direction in a waveguide that may include a rib section disposed on a slab section. The method also includes transforming a first optical mode of the optical signal in a first cross-sectional segment of the waveguide to a second optical mode in a second cross-sectional segment of the waveguide, where the first cross-sectional segment and the second cross-sectional segment are defined in different parallel planes perpendicular to the first direction, where the width of the rib section is different in the first cross-sectional segment from the second cross-sectional segment, where the width is defined in a second direction perpendicular to the first direction, and the rib section projects from the slab section in a third direction perpendicular to the first direction and the second direction.

One example embodiment is an optical waveguide. The optical waveguide also includes a slab section including an active region configured to transmit optical signals in a first direction. The waveguide also includes a rib section projecting from the slab section in a second direction perpendicular to the first direction, where the rib section has a smaller width than the slab section, and the width of the rib section tapers along the first direction.

EXAMPLE EMBODIMENTS

Waveguides in photonic devices, such as lasers and amplifiers, serve many purposes. Waveguides supporting small optical modes may be used to maximize confinement in an active region of a device to create efficient optical gain. Larger waveguides provide efficient propagation (e.g., low scattering loss, etc.) for large mode optical signals, where the large mode optical signals may be located near a fiber optical cable coupling, laser source, or other coupling interface in a Si photonics platform.

In some example Si photonic platforms, routing within a chip typically uses waveguides with smaller optical modes. Small waveguide modes are ideal to couple between many devices integrated within the same chip. These integrated devices may include both passive elements and active elements, such as modulators, requiring tight optical confinement. These smaller modes limit the power scaling of the waveguides and limit the ability of optical signals to be efficiently and simply coupled into the platforms from large optical mode sources without the use of mode converters or other coupling structures.

Some existing solutions to provide waveguides that couple optical signals into photonic chips include slab-coupled optical waveguides (SCOWs). In some examples, SCOWs include a rib structure and a slab section, where the slab section advantageously filters out unwanted modes from the desired or designed mode in the optical waveguide and the rib structure provides a thick waveguide section for propagating optical signals. Typical SCOWs also have limitations similar to waveguide structures described above. For example, smaller waveguides, including smaller SCOWs, may result in larger power densities within the waveguide structure, which in turn increases self-heating of the photonic device and limits the overall power of the device/platform.

Large SCOWs, where the rib section is large/thick, provide for a large mode optical signal to travel through the waveguide, but it is often challenging to convert that large mode optical signal to one that is more tightly confined in the quantum wells, quantum dots, quantum wires, or bulk active region of the SCOW for high gain. Typical SCOWs with an active region in the rib require a wide rib to achieve high optical confinement in the active region, which risks creating a waveguide structure with multiple spatial modes—something undesirable for coupling to other devices or chips. Tailoring the confinement of large modes within active gain regions is important for current and future integrated laser structures (e.g., distributed feedback lasers (DFBs), etc.), and to provide for scaling to higher powers and higher data rates (e.g., faster modulation, more channels, etc.) in future optical communication systems. A general need has emerged for laser technology that would support the integration of structures targeted for different purposes on a single chip while sharing a common fabrication process.

The structures and methods described herein include an inverted SCOW structure, which inverts the polarity of a typical SCOW diode and includes an active region located within the slab section of the SCOW. The dimensions of the SCOW structure can be adjusted to alter the optical confinement within the active region, creating structures suited for high gain and low optical power and structures best suited for low gain and high optical power. Such optimization of the SCOW structure can also create areas with strong optical confinement for tight waveguide bends and areas close to the output facet with low optical confinement to simplify fiber coupling. One implementation of the SCOW structure provides for light to be transferred vertically between materials with differing optical gain and refractive index. The inverted SCOWs described herein provide for easily adjustable optical mode confinement or overlap in an active region/gain medium without the risks of generating multiple spatial modes or high electrical resistance.

FIG. 1A illustrates cross-section 101 of an inverted slab-coupled optical waveguide according to an embodiment described herein. Waveguide 100 includes a slab section 110, a rib section 130, an active region 120, cladding 140, and cladding 150. The position or location of the active region 120 within the slab section 110, as well as the polarity of the cladding 140 and 150, provides the advantageous inverted structure of the SCOW in the waveguide 100.

The cross-section 101 illustrates a cross section of the waveguide along an X-axis and a Y-axis. In some examples, the slab section 110 has a slab width 114, in a first direction along the X-axis, and a slab height 112, in a second direction along the Y-axis. For example, the slab section 110 has a first side 115 (shown as a top side in the orientation of the waveguide 100 shown in FIG. 1A) and a second side 117 (shown as a bottom side in the orientation shown in FIG. 1A).

In some examples, rib section 130 is formed on the first side 115 of the slab section and the rib section projects or extends from the slab section in the second direction along the Y-axis. The rib section includes associated widths and heights including rib width 132 along the X-axis and rib height 134 along the Y-axis. In this example, the rib height 134 extends from a rib edge 135 to the second side 117 of the slab section 110. The rib width 132 is less than the slab width 114 and the rib height 134 is greater than the slab height 112. In some examples, the cross-section 101 is a face view of the waveguide 100 where optical signals or light signals that travel or propagate through the waveguide 100 travel into or out of the cross-section 101 along the Z-axis (i.e. toward or away from the viewer of FIG. 1A).

In some examples, the rib section 130 and the slab section 110 provides mode filtering of the optical signal propagating through the waveguide. For example, the slab section 110 allows unwanted optical modes to be filtered and radiated away into the slab via the active region 120. For example, a light or optical signal traveling through the waveguide 100 may include a first optical mode 105 and second optical mode 106*a*. The first optical mode 105 is a desired mode and the mode that the waveguide 100 is designed to transmit. The second optical mode 106*a* is not desired and is filtered out and radiates into the slab section 110 via mode radiation 107 in the Y-axis direction in the active region 120 as optical mode 106*b*.

In some examples, the slab section 110 and the rib section 130 are formed from a bulk material and the active region 120 includes a gain medium such as quantum wells or other suitable active region materials. In some examples, the waveguide 100 may be formed using III-V semiconductor materials including Indium phosphide (InP) based materials and/or Gallium arsenide (GaAs) based materials as described in more detail in relation to FIGS. 5 and 6A-C. The slab section 110 and rib section 130 may also be formed using multiple layered or interleaved materials with varying refractive indexes, the varying materials allow for greater etch control in the fabrication of the waveguide 100 as well as greater manufacture tolerances as described in more detail in relation to FIG. 1B.

Figure 1B:
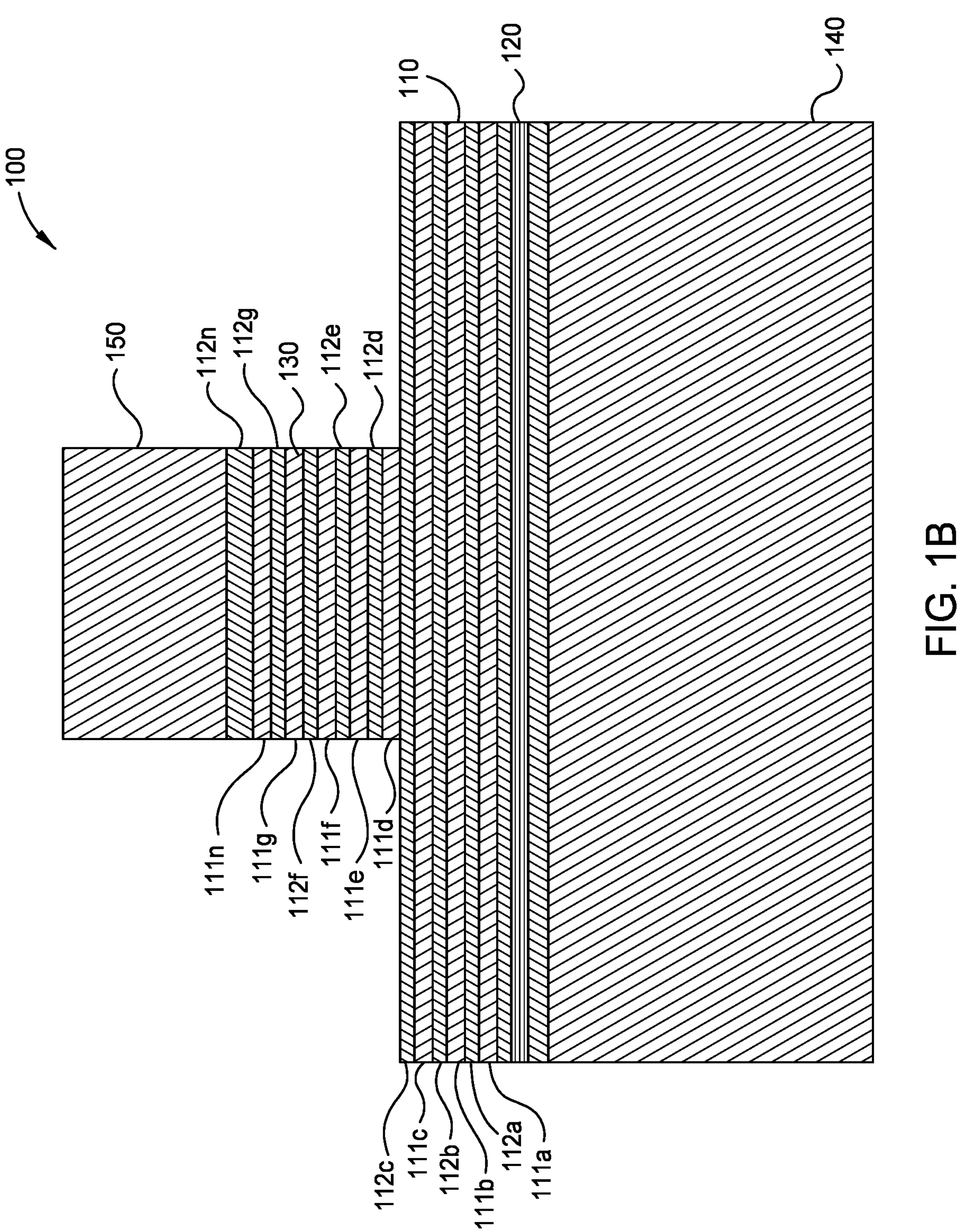
FIG. 1B illustrates an interleaved inverted slab-coupled optical waveguide, according to an embodiment described herein.

FIG. 1B illustrates an interleaved inverted slab-coupled optical waveguide, according to an embodiment described herein. As described above, the waveguide 100 may include bulk materials such as bulk materials commonly used in forming SCOWs. In another example, the waveguides are formed from layered or interleaved materials. For example, instead of using a bulk waveguide on the n-side of the structure (i.e., between active region 120 and cladding 150), a dilute waveguide structure (alternating layers of higher and lower index material) can be utilized within the waveguide 100.

For example, the slab section 110 and the rib section 130 include at least two layers of a first material interleaved with at least two layers of a second material. The first material and the second material may have different indices of refraction. For example, a first material forms the layers 111*a*-111*n* and a second material forms the layers 112*a*-112*n*. The first material has a first reactive index and the second material has a second refractive index different from the first refractive index.

In some examples, changing the relative thicknesses of the alternating layers alters or adjusts the effective refractive index of the waveguide 100. For example, adjusting a ratio of layers 111*a*-111*n* relative to layers 112*a*-112*n* adjusts the effective refractive index of the waveguide 100. For example, a ratio of the layers may include 50/50 between the alternating layers where the layers 111*a*-111*n* have a refractive index of 3.2 and the layers 112*a*-112*n* have a refractive index of 3.3. The combined effective index of the layers is approximately 3.25, and may be adjusted by adjusting the ratio between the layers. For example, the layers 111*a*-111*n* may be thicker than the layers 112*a*-112*n* in order to provide a desired effective refractive index lower than 3.25. Alternatively, the layers 111*a*-111*n* may be thinner than the layers 112*a*-112*n* in order to provide a different desired effective refractive index (e.g., higher than 3.25). In some examples, there may additional materials in the layers. For example, the layers 111*a*-111*n* and the layers 112*a*-112*n* may include three or more materials in alternating or otherwise interleaved layers. In some examples, the layers 111*a*-111*n* have differing thickness based on the placement of the layer in the slab section 110 and the rib section 130. The layers 112*a*-112*n* may also have differing thickness based on the placement of the layer in the slab section 110 and the rib section 130.

In some examples, the use of the dilute waveguide, such as waveguide 100, allows for error tolerance in fabrication. For example, in a bulk material waveguide, an error in the bulk material may alter the refractive index such that the waveguide is non-usable. In the waveguide 100 in FIG. 1B, an error in one material layer (e.g., the layer 111*c*) has less overall effect on the effective index of an entirety of the waveguide 100, such that the error in the single layer does not render the waveguide un-usable.

Additionally, during fabrication of the waveguide 100, the alternating layers may provide an easily detectable etch depth. For example, as a fabrication device or fabricator forms the rib section 130 and slab section 110, the material of each layer provides an etch depth indication to a fabricator, where the fabricator may detect and determine a depth of an etch more precisely than a bulk material waveguide. In some examples, the dilute inverted SCOW, such as the waveguide 100 may be based on GaAs material or InP materials as described in relation FIGS. 5-6C below.

Returning back to FIG. 1A, in some examples, such as non-inverted SCOWs (not shown in FIG. 1A), cladding 150 is a p-type cladding layer and lower cladding is an n-type cladding layer. Additionally, a gain medium or active region of the SCOW is located adjacent to an upper cladding and within a rib section of the SCOW. These examples are limited in the ability to adjust the optical mode of optical signals into and out of active region of the SCOW.

In the examples shown in FIG. 1A and described in more detail in relation to FIGS. 2A-6C, the cladding 150 is an n-type cladding and the cladding 140 is a p-type cladding. The cladding 140 is positioned on the second side 117 of the slab section 110, where the p-type cladding is on the opposite side of the slab section 110 from the rib section 130. The cladding 150 is positioned on the rib edge 135, where the n-type cladding is positioned on the rib section 130 opposite of the slab section 110 and the first side 115. In some examples, the slab section 110 and the rib section 130 are formed using a n-type waveguide material, which may have high carrier mobility (in contrast to p-type material). In some examples, the waveguide 100 may also include a current confinement region described in more detail in relation to FIGS. 4A-4B to reduce current spreading through the slab section (e.g., current spreading in the X-axis direction instead of being confined in the Y-axis direction).

Additionally, the position of the active region 120 in the slab section 110 is inverted from a typical positioning of a gain medium in a slab section. For example, the active region 120 is positioned in the slab section 110 near or adjacent to the second side 117 such that a portion of the slab section between the active region 120 and the first side 115 is greater than a portion of the slab section between the active region 120 and the second side 117.

In some examples, the inverted location of the active region 120 and the inverted polarity of the cladding 140 and the cladding 150 allows for greater flexibility and adjustments of the optical mode within the waveguide 100. For example, the waveguide 100, with varying rib widths 132 along the various cross-sections of the waveguide, provides a portion of the waveguide where the optical mode of the optical signal is very large and has little overlap with the active region 120 (e.g., high power, lower loss). In another example, the waveguide 100 provides a portion of the waveguide where the optical mode is very small and overlaps with the active region 120 (e.g., lower power, high gain).

The varying portions of the waveguide 100 allows for transmitting an optical signal in the third direction along the Z-axis in the waveguide 100 and changing a first optical mode of the optical signal in a first cross-sectional segment of the waveguide to a second optical mode in a second cross-sectional segment of the waveguide. In some examples, the location of the optical mode within the waveguide 100 is controlled or adjusted via the rib width 132 along the waveguide 100. For example, a narrower or smaller rib width pushes the optical mode into the active region 120 while a wider rib width 132 moves the optical mode away from the active region 120. The various adjustments of the optical signal are described in more detail in relation to FIGS. 2A-2C.

Figure 2A:
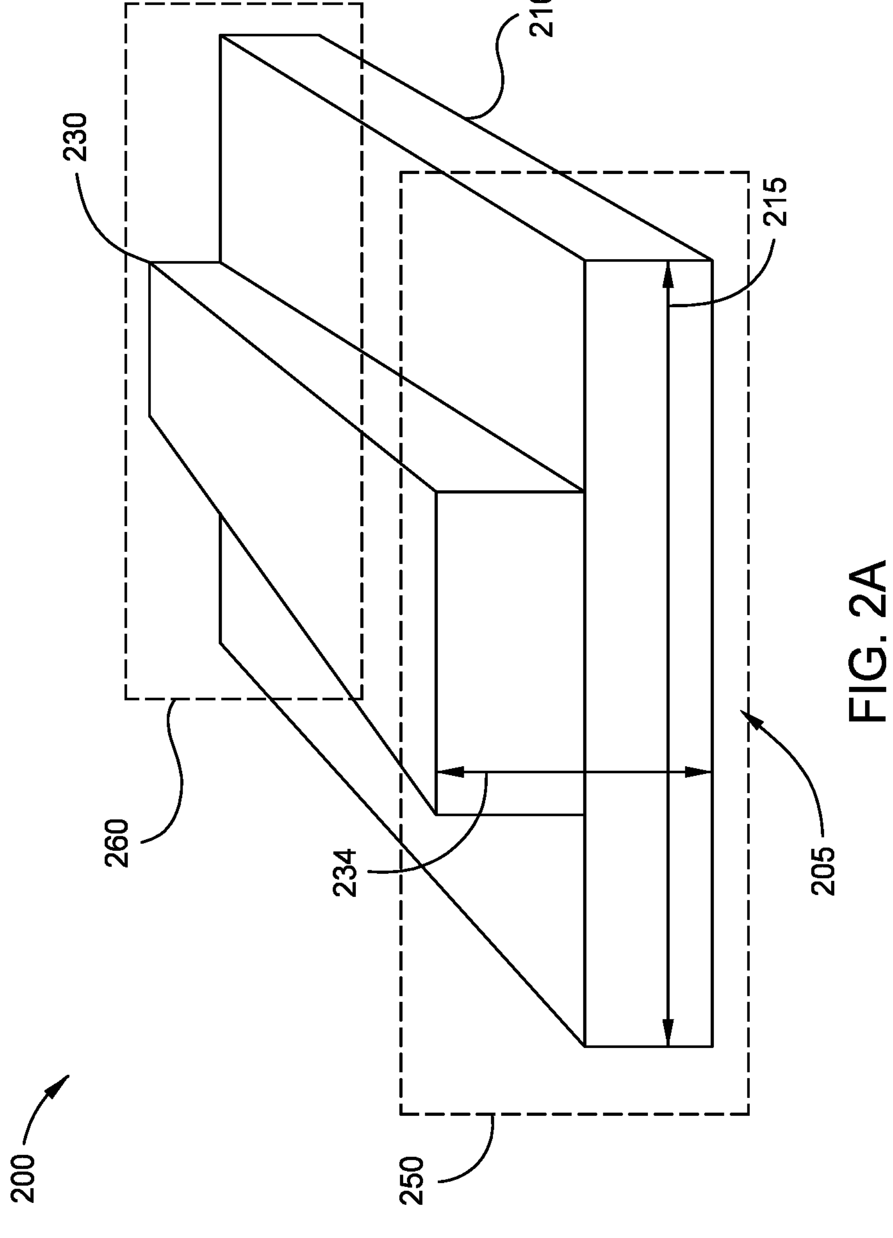
FIG. 2A illustrates an inverted slab-coupled optical waveguide according to an embodiment described herein.
Figure 2B:
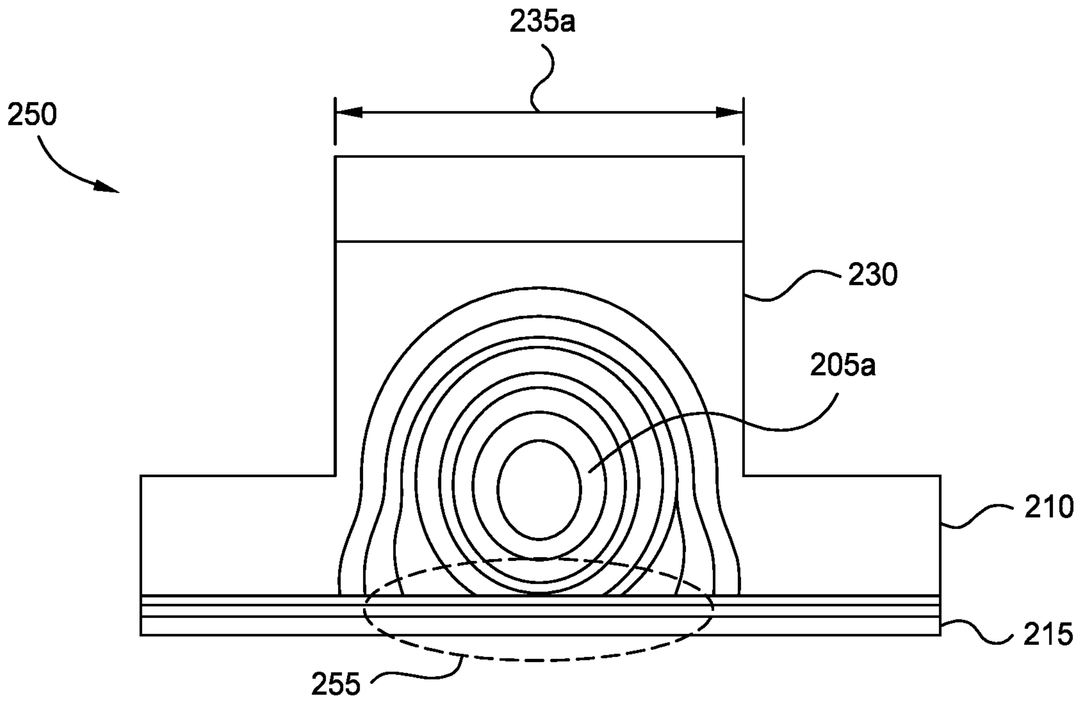
FIGS. 2B-C illustrate cross-sections of an inverted slab-coupled optical waveguide, according to embodiments described herein.
Figure 2C:
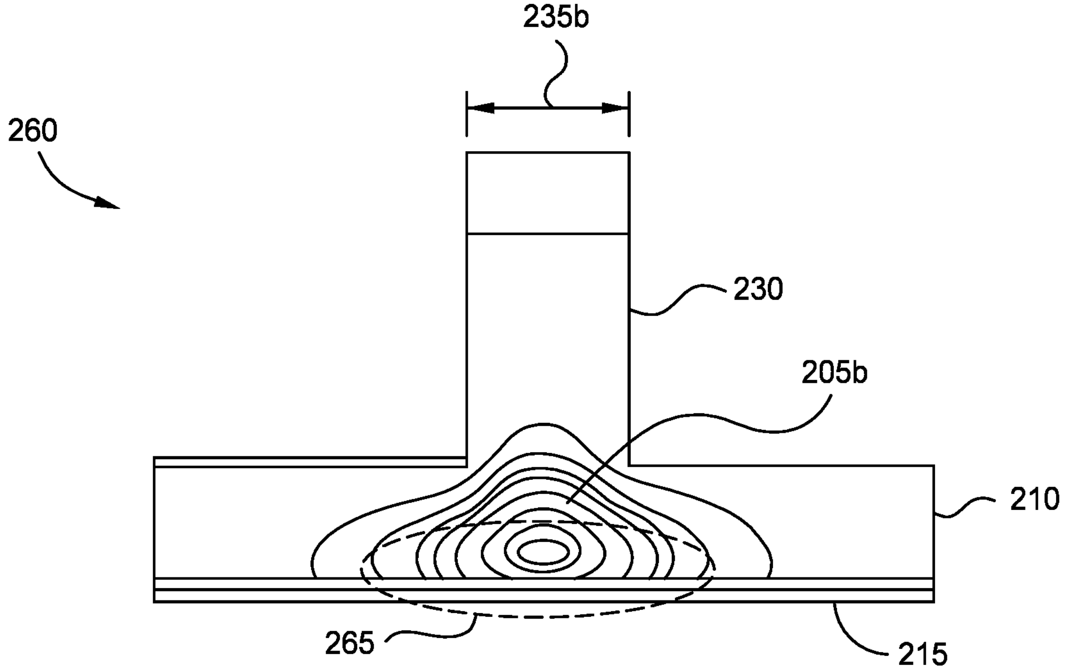

FIG. 2A illustrates an inverted slab-coupled optical waveguide and FIGS. 2B-C illustrate cross-sections of the inverted slab-coupled optical waveguide illustrated in FIG. 2A, according to embodiments described herein. Waveguide 200 is an inverted SCOW and includes a slab section 210, an active region 215, and a rib section 230. The waveguide 200 includes an optical signal 205 traveling or propagating through the waveguide 200. The rib section 230 has a rib height 234 and at a first cross-section 250 the rib section 230 has a first rib width and a second cross-section 260 the rib section has a second rib described in more detail in FIG. 2B. In some examples, the first cross-section 250 and the second cross-section 260 are cross-sectional segments of the waveguide 200 and are defined in different parallel planes.

For example, as shown the first cross-section 250 in FIG. 2B, the rib section 230 has a first rib width 235*a*, where the first rib width 235*a* is a relatively wide rib width within the waveguide 200. For example, in the first cross-section 250 the rib height 234 may be at least 4 micrometers (μm) and the first rib width 235*a* may be at least 5 μm wide. The first rib width 235*a* provides for a large weakly confined optical mode. For example, an optical mode profile 205*a* of the optical signal 205, shown in FIG. 2A, has little overlap with the active region 215 as shown in overlap area 255.

In some examples, the optical mode profile 205*a* allows for the optical signal 205 to propagate through the portion of the waveguide 200 associated with the first cross-section 250 at a high power without causing large amounts of heat generation. Additionally, the large profile of the rib section 230 in the first cross-section 250 and the large mode size of the optical mode profile 205*a* provided in the first cross-section 250 provides for good coupling efficiency and alignment tolerance enabling passive alignment and bonding of the waveguide 200 with large optical mode sources without the need for bulky or complicated spot converters or other types of adapters.

In another example, shown in the second cross-section 260 in FIG. 2C, the rib section 230 has a second rib width 235*b*. In some examples, the optical mode profile 205*b* is centered closer to the active region 215 in the slab section than the optical mode profile 205*a* described above. In this example, the second rib width 235*b* is smaller than the first rib width 235*a* within the waveguide 200. For example, the rib height 234 in the second cross-section 260 is at least 4 μm and the rib width 235*b* is approximately 2 μm. The smaller or more narrow width of the second rib width 235*b* causes the optical signal 205 and the optical mode profile 205*b* to be confined to a smaller region and provides greater overlap with the active region 215 as shown in the overlap area 265.

Figure 3:
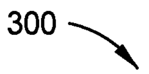
FIG. 3 is a method for changing an optical mode, according to an embodiment described herein.
Figure 3:
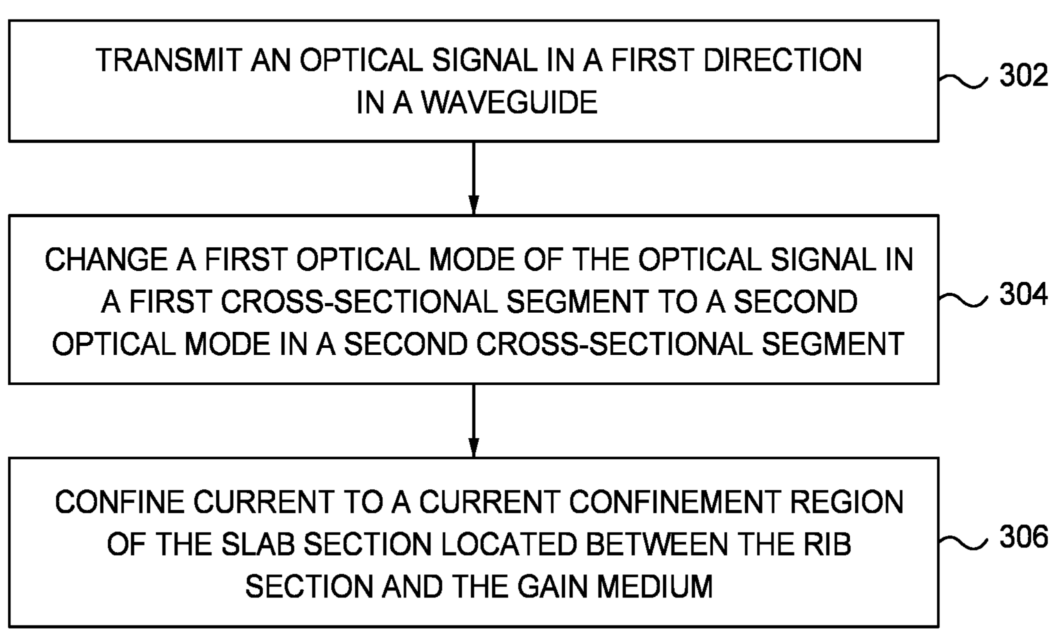

Additionally, the physical design of the waveguide 200 (and the waveguide 100 in FIG. 1A) allows generation of very high optical powers (>100 milliwatts (mW) to 1+W) which is approximately an order of magnitude higher than conventional diode lasers. As with the waveguide 100, the placement of the active region 215 within the slab section 210 and reversed diode polarity allows for simple optical mode conversion via the adjustment of the rib widths along the waveguide. For example, FIG. 3 is a method for changing an optical mode, according to an embodiment described herein.

Method 300 begins at block 302 an optical signal transmits in waveguide in a first direction. For example, the optical signal 205 transmits or propagates through the waveguide 200. At block 304, the waveguide 200 changes a first optical mode of the optical signal in a first cross-sectional segment to a second optical mode in a second cross-sectional segment. For example, the varying portions of the waveguide 200 allows for transmitting the optical signal 205 through the waveguide and changing a first optical mode of the optical signal 205 such as the optical mode in optical mode profile 205*a* in in the cross-section 250 a second optical mode of the optical signal 205 such as the optical mode in optical mode profile 205*b* in in the second cross-section 260. At block 306, method 300 includes confining current to a current confinement region of the slab section located between the rib section and an active region in the slab section. In some examples, current confinement is further described in relation to FIGS. 4A-4B.

Figure 4A:
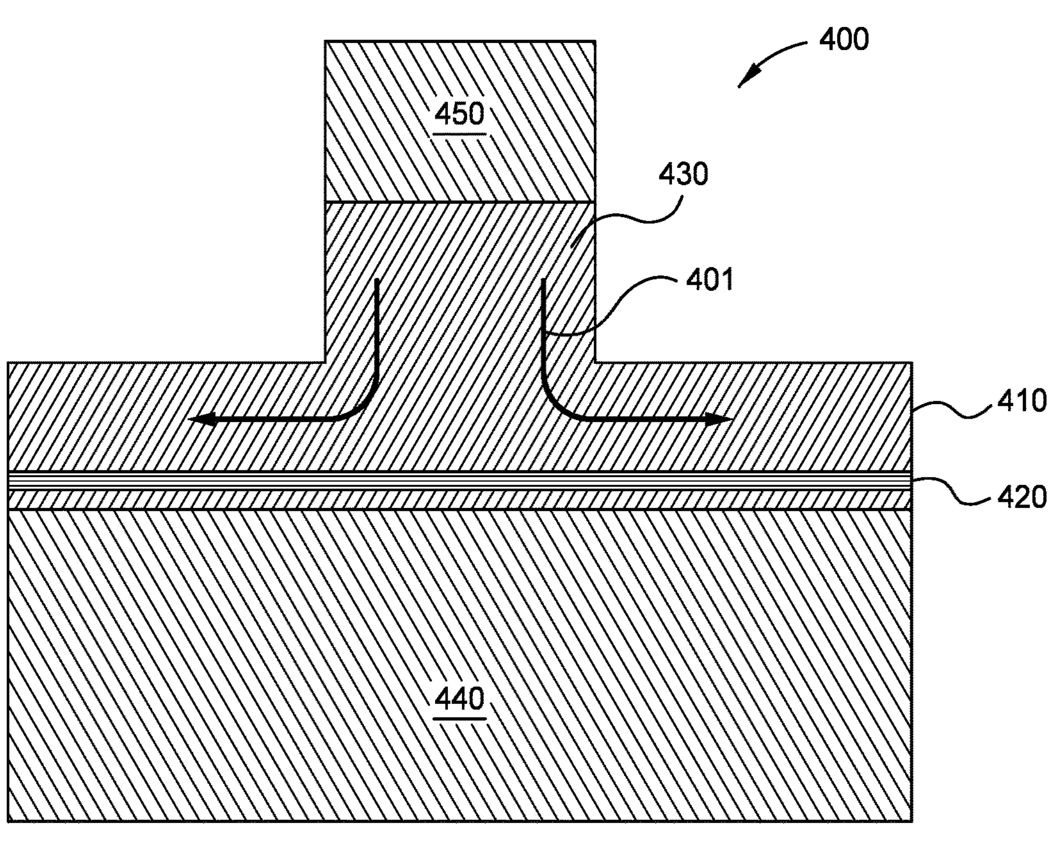
FIGS. 4A-B illustrate currents in a slab-coupled optical waveguide, according to an embodiments described herein.
Figure 4B:
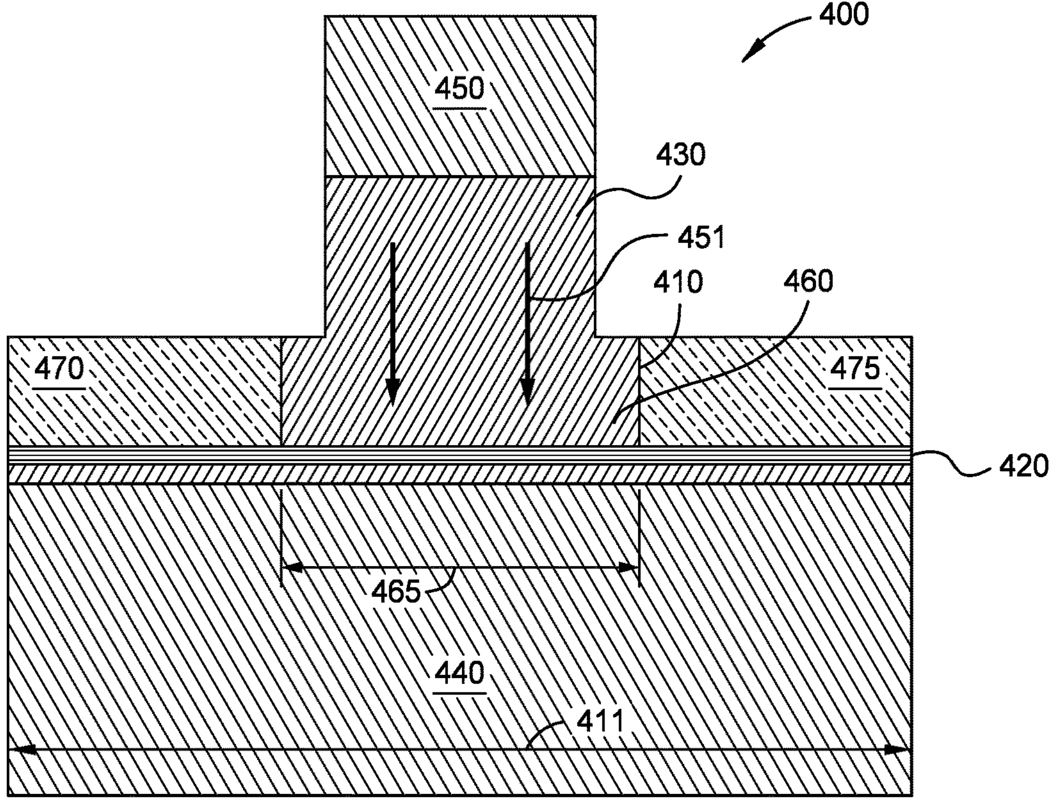

FIGS. 4A-4B illustrate currents in a slab-coupled optical waveguide, according to embodiments described herein. Waveguide 400 is an inverted SCOW similar to any of the waveguides 100 and 200, described herein. In FIG. 4A, the waveguide 400 includes slab section 410, active region 420, rib section 430, cladding layer 440, and cladding layer 450. In some examples, the waveguide 400 includes a spreading current 401 between a cladding layer 440 and a cladding layer 450. In some examples, the n type material of the cladding layer 450, the slab section 410, and the rib section 430 has a higher mobility of carriers. This higher mobility may result current spreading. For example, current 401 spreads through the slab section 410 of the waveguide 400, above the active region 420. In some examples, the spreading of current 401 may cause drops in laser efficiency and a confined current may be desired in the waveguide to address potential current spread.

For example, waveguide 400 in FIG. 4B, includes a current confinement region 460 located between the rib section 430 and the active region 420, where the current confinement region is a subsection of the slab section 410. The confinement region has a confinement width 465, where the confinement width is a smaller width than the slab width 411. In some examples, the confinement width is less than a slab width 411 of the slab section 410. For example, the confinement width 465 may include a width wide enough for an optical signal to propagate through the waveguide 400 without causing current loss in the waveguide. For example, the current 451 is confined in the current confinement region 460.

In some examples, the current confinement region 460 is defined by a first region 470 formed using proton implantation in the slab section 410 (i.e. a proton implantation region) on a first side of the current confinement region and a second region 475 formed in the slab section region using proton implantation on a second opposite side of the current confinement region. The first region 470 and the second region 475 may also be formed using non-conductive regrowth material formed in the slab section 410 (e.g., iron-doped InP or current-blocking p-n-p or n-p-n junctions, etc.). For example, the first region 470 is a first insulator region grown on a first side of the current confinement region where a first portion of the slab section 410 has been removed. The second region 475 is a second insulator region on a second side, of the current confinement region 460 where a second portion of the slab section has been removed, and where the second side is opposite to the first side of the current confinement region.

In some examples, the first region 470 and second region 475 may also be formed using a thin layer(s) that can be oxidized (e.g., Al-containing layers such as AlGaAs or Al(Ga)InAs with high Al fraction) in the slab section 410. The oxidizable layer or layers may be oxidized in the slab section 410 and left unoxidized under the rib section 460 using conventional processes (e.g., dry or wet oxidation)

Figure 5:
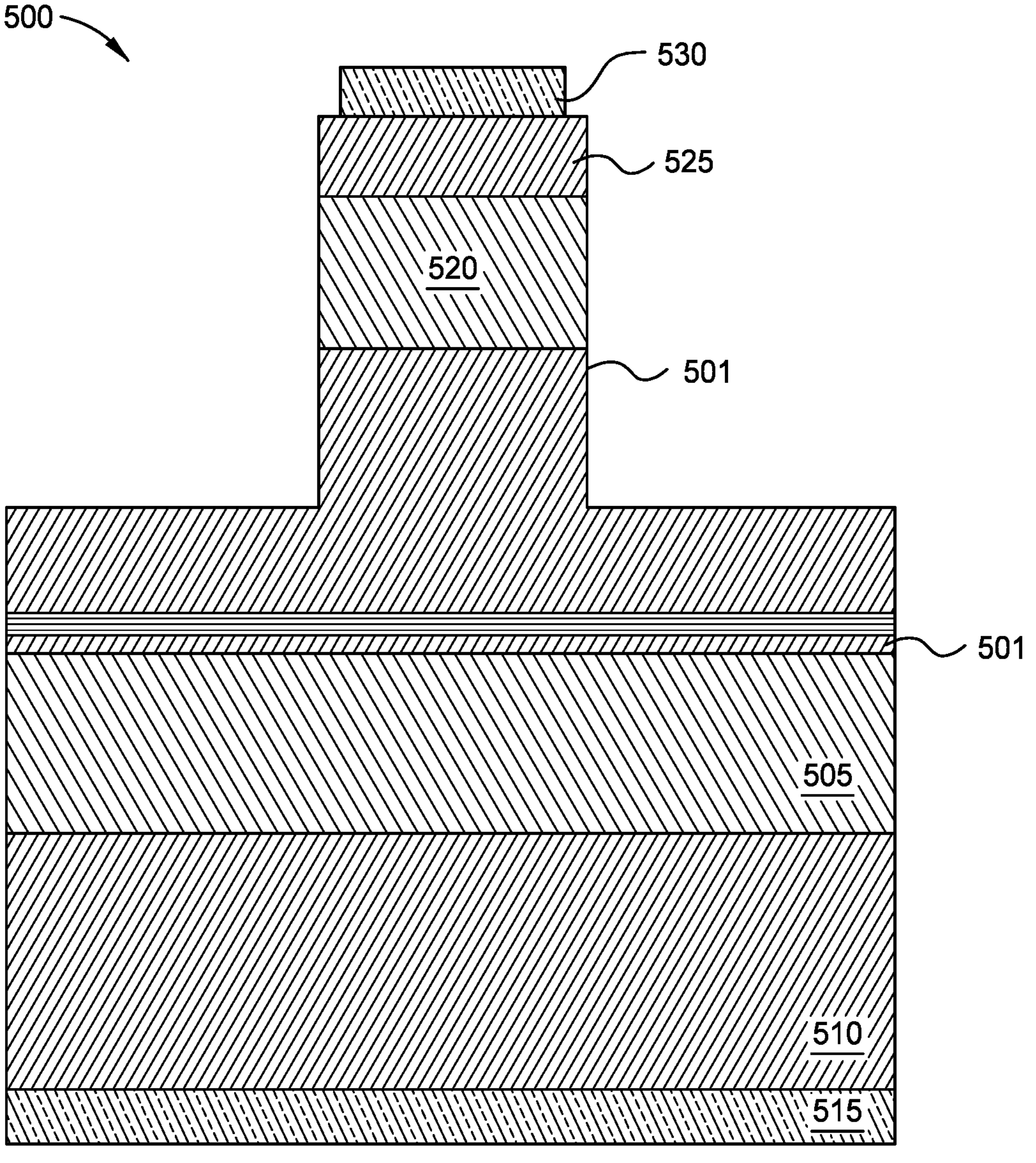
FIG. 5 illustrates a slab-coupled optical waveguide with conductive structures, according to an embodiments described herein.

FIG. 5 illustrates a slab-coupled optical waveguide with conductive structures, according to an embodiments described herein. As described above, the various waveguides herein are inverted SCOWs where n-type and p-type regions are inverted or reversed relative to typical SCOWs. In some examples, typical materials and fabrication methods are used to fabricate the inverted SCOWs and associated Si platforms.

For example, platform 500 in FIG. 5 is a GaAs based platform and includes a waveguide 501. Such GaAs-based layers include binary, ternary or quaternary semiconductor materials with a lattice constant suitable for epitaxial growth on GaAs substrates. The waveguide 501 may include any of the inverted SCOWs described herein including the rib section, and slab section, and active region of any of the waveguides 100, 200, and 400. The platform 500 also includes cladding layers 505 and 520, substrate 510, layer 525, and contacts 515 and 530. In some examples, the substrate 510 is a p-type GaAs substrate and cladding layer 505 is a p-type aluminum gallium arsenide (AlGaAs) layer between the substrate 510 and the waveguide 501.

In some examples, the rib section and the slab section of the waveguide 501 are at least an n-type AlGaAs. In some examples, the cladding layer 520 is an n-type AlGaAs layer and the layer 525 is an n-type GaAs layer. The contact 530 may include a standard n-type Ohmic contact metal for GaAs (e.g., gold germanium (AuGe), nickel (Ni), gold (Au), etc.) and the contact 515 is a standard p-type Ohmic contact metal for GaAs (e.g., titanium (Ti), Au, etc.). In some examples, growing n-type and p-type GaAs layers forming the associated Ohmic contacts is a simple and efficient process and may be used to form the inverted SCOWs using GaAs standard materials and processes on a p-type substrate. Other III-V materials may also be used to form the inverted SCOWs as shown in FIGS. 6A-C.

Figure 6A:
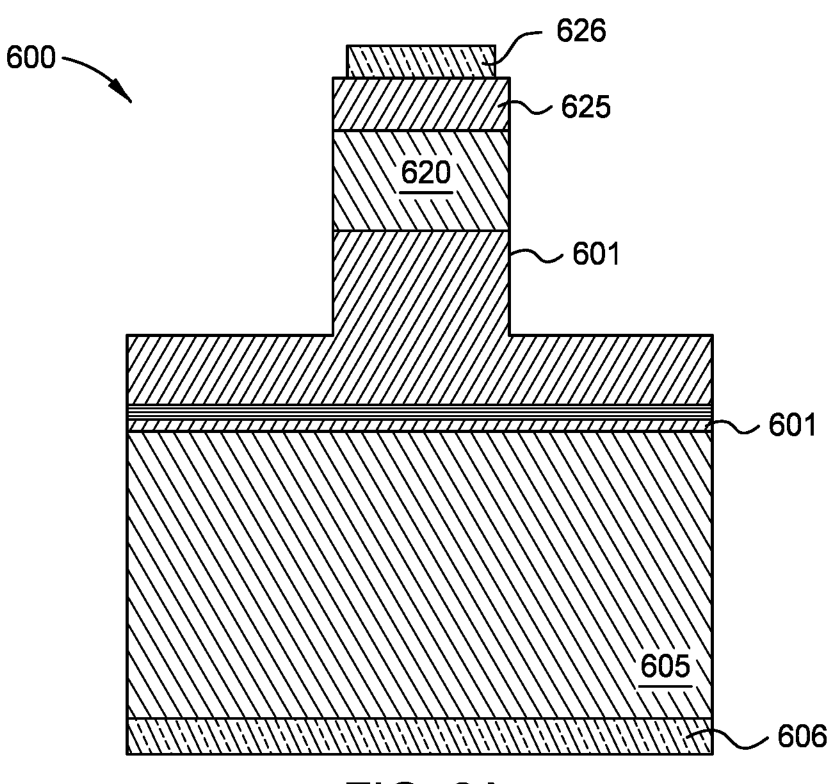
FIGS. 6A-C illustrate slab-coupled optical waveguides with conductive structures, according to an embodiments described herein.
Figure 6B:
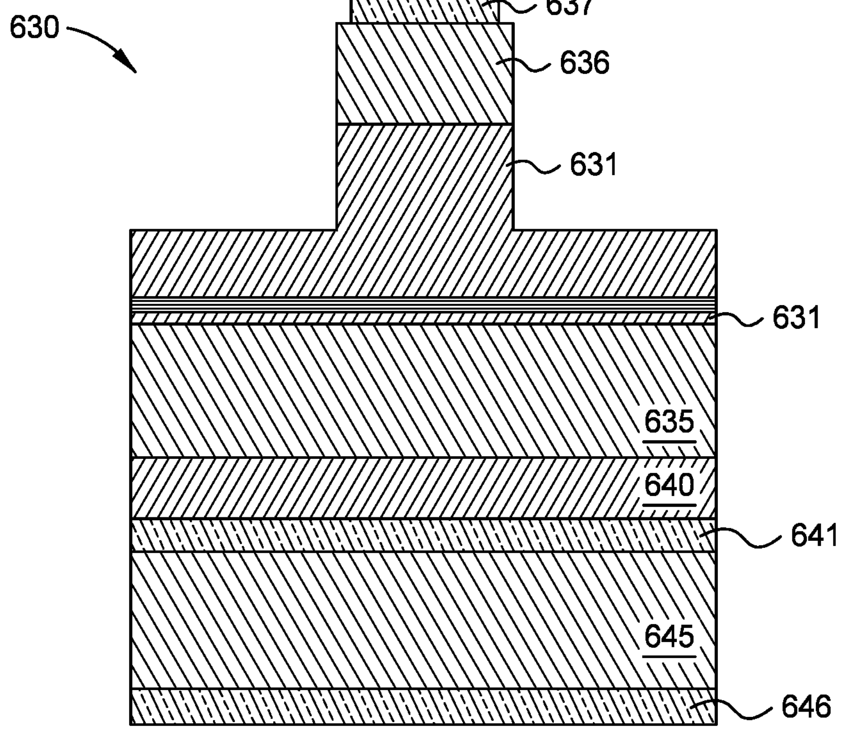
Figure 6C:
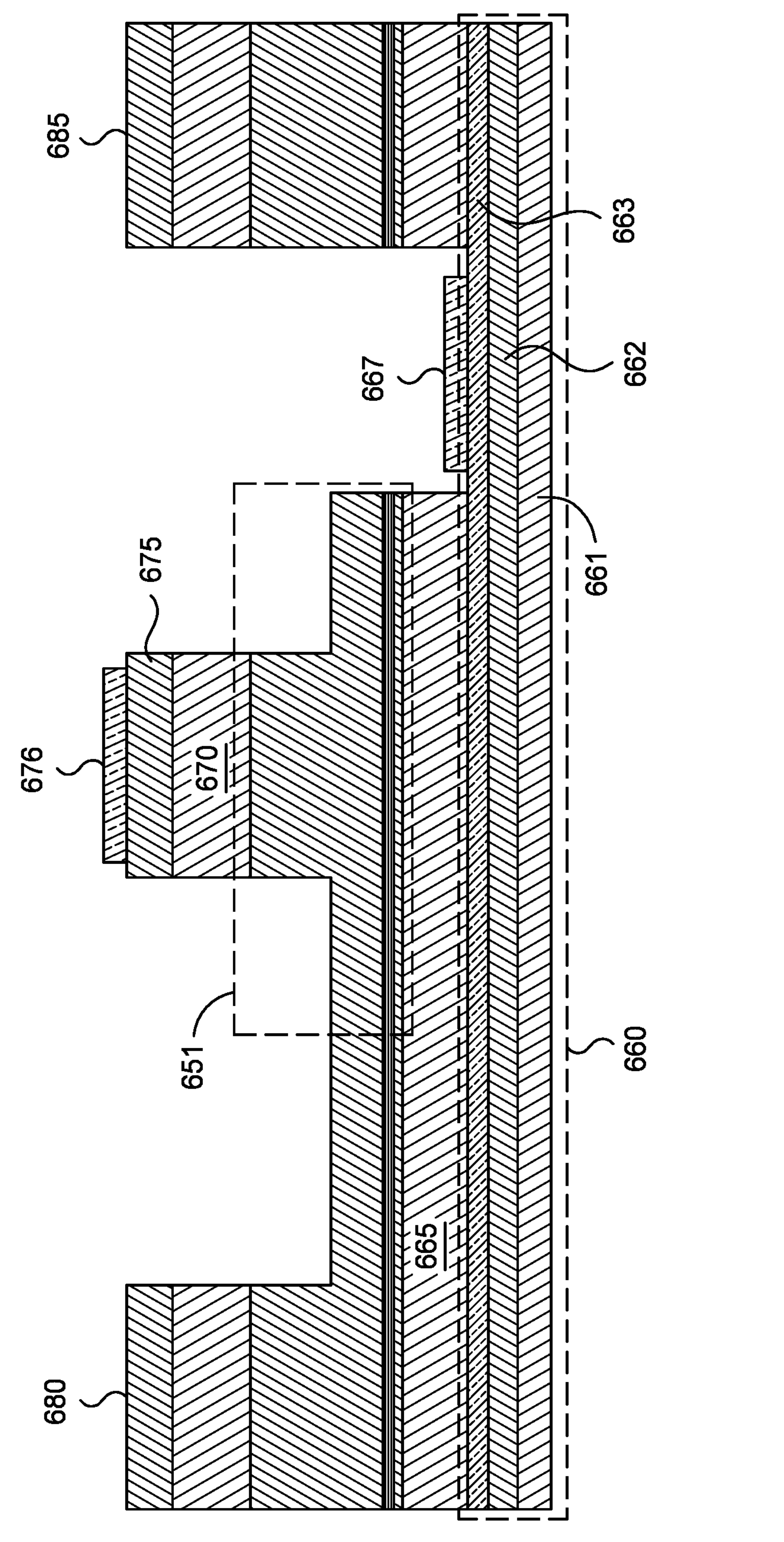

FIGS. 6A-C illustrates slab-coupled optical waveguides with conductive structures, according to embodiments described herein. FIG. 6A illustrates platform 600 in an InP based platform. Such InP-based layers include binary, ternary or quaternary semiconductor materials with a lattice constant suitable for epitaxial growth on InP substrates. The waveguide 601 may include any of the inverted SCOWs described herein including the rib section, and slab section, and active region of any of the waveguides 100, 200, and 400. The platform 600 also includes cladding substrate 605 and contact 606. The platform also includes cladding 620, layer 625, and contact 626.

In some examples, cladding substrate 605 is a p-type InP substrate and contact 606 is a p-type Ohmic metal contact for InP (e.g., Ti, Pt, Au, etc.). The waveguide 601 is a n-type indium gallium arsenide phosphide (InGaAsP), the cladding 620 is n-type InP, the layer 625 is n-type indium gallium arsenide (InGaAs), and the contact 626 is a n-type Ohmic metal contact for InGaAs (e.g., Ge, Ni, Au, etc.).

In some examples, growth of various layers and forming contacts for the platform 600 is challenging on p-type InP substrates. For example, Zn diffusion from the InP substrate may add variability to the location of the diode's p-n junction and cause problems in the active region. For example, Zn diffusion may cause disordering of quantum wells in the active region or other mechanisms that reduce the optical gain. Additionally, low-resistance p-type Ohmic contacts to p-type InP substrates are challenging to fabricate, and metals in annealed n-type contacts could potentially diffuse towards the active region and increase optical loss. In some examples, a different dopant (e.g., Cadmium) or a buffer of un-doped material, as a first or second deposited metal in a stack, mitigates Zn diffusion. In some examples, a barrier metal such as Pt also prevents n-metal diffusion. The higher contact resistance of the p-substrate can be mitigated be using a highly doped, thin, and broad-area contact region.

FIG. 6B illustrates an alternate platform InP based platform, platform 630. The waveguide 631 in FIG. 6B may include any of the inverted SCOWs described herein including the rib section, and slab section, and active region of any of the waveguides 100, 200, and 400. The platform 630 also includes cladding layer 635, substrate 640, contact 641, handle substrate 645, and contact 646. The platform also includes cladding 636 and contact 637.

In some examples, the cladding layer 635 is a p-type InP layer, substrate 640 is p-type InGaAs, contact 641 is a p-type Ohmic metal contact for InP (e.g., Ti, Au, etc.,), and handle substrate 645 is a conductive substrate. The waveguide 631 is n-type indium gallium arsenide phosphide (InGaAsP), the cladding 636 is n-type InP, and the contact 637 is an n-type Ohmic metal contact.

In some examples, to provide simplicity in fabrication, the epitaxial structure of the platform 630 is first grown upside down on an n-substrate with a metallized top A-side. For example, a fabricator forms the cladding 636 as an n-type substrate and grows the waveguide 631 (and associated active region) on the cladding 636. The fabricator also forms the cladding layer 635 on the waveguide 601 and the substrate 640 on the cladding layer 635. The fabricator also metallizes the top of the substrate 640 by forming the contact 641 and flips the upside down structure and bonds it to the handle substrate 645. The fabrication then processes the epitaxial structure into the platform 630 shown in FIG. 6B. This process allows for ease of fabrication in growing the various layers using InP processes while also providing the inverted SCOW.

FIG. 6C illustrates an alternate platform InP based platform, platform 650. The waveguide 651 in FIG. 6C may include any of the inverted SCOWs described herein including the rib section, and slab section, and active region of any of the waveguides 100, 200, and 400. The platform 650 also includes cladding layer 665, substrate 660, contact 667, cladding 670, layer 675, and contact 676.

In some examples, the contact 667 is a p-type Ohmic contact for InP and is located on a same side of the substrate 660 (e.g., a top of the substrate) as the cladding layer 665. In some examples, the p-type contact on the top side of the substrate 660 avoids having to conduct through the substrate 660 and allows use of conventional InGaAs contact layer and Ohmic contact metal. In some examples, the substrate 660 is a p-type substrate layer.

In another example, the substrate 660 is an insulating material, un-doped material, or an n-type substrate. In this example, substrate 660 includes substrate layer 661 and insulating layers 662 and 663. In some examples, the insulating layer 662 is p-type InGaAs and the insulating layer 663 is proton-implanted p-type InGaAs, where the insulating layers have a sufficient thickness between the substrate layer 661 and the cladding layer 665 to keep resistance low.

In some examples, the p-type contact, contact 667 is located on one or both sides of the waveguide 651. For example, a contact may also be located in the void between waveguide and structure 680 in a manner similar to the contact 667 between the waveguide 651 and structure 685. In some examples, the cladding layer 665 is a p-type InP layer, substrate 640 is p-type InP, contact 667 is a p-type Ohmic metal contact for InP (e.g., Ti, Au, etc.,). The waveguide 651 is n-type InGaAsP, the cladding 670 is n-type InP, layer 675 is n-type InGaAs, and the contact 676 is an n-type Ohmic metal contact.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An optical waveguide, comprising:
a slab section comprising a slab width in a first direction, the slab section further comprising a current confinement region;
a rib section formed on a first side of the slab section, wherein the rib section comprises a rib width in the first direction that is less than the slab width, and wherein the rib section comprises a rib height in a second direction perpendicular to the first direction; and
an active region positioned in the slab section,
wherein a p-cladding layer is positioned on a second side of the slab section opposite to the rib section;
wherein an n-cladding layer is formed on a first side of the rib section opposite to the slab section,
wherein the current confinement region extends contiguously from the rib section to the active region, and
wherein the current confinement region has a confinement width that is greater than the rib width.

2. The optical waveguide of claim 1, wherein the rib width comprises a first width in a first cross-sectional segment of the optical waveguide, wherein the rib width comprises a second width, different from the first width, in a second cross-sectional segment of the optical waveguide, wherein the first cross-sectional segment and the second cross-sectional segment are defined in different parallel planes.

3. The optical waveguide of claim 1, wherein the slab section and the rib section include at least two layers of a first material interleaved with at least two layers of a second material, wherein the first material and the second material have different indices of refraction.

4. The optical waveguide of claim 1, wherein the confinement width is less than the slab width.

5. The optical waveguide of claim 4, wherein the current confinement region is defined by a first proton implantation region formed in the slab section on a first side of the current confinement region and a second proton implantation region formed in the slab section on a second side of the current confinement region, wherein the second side is opposite to the first side of the current confinement region.

6. The optical waveguide of claim 4, wherein the current confinement region is defined by a first insulator region grown on a first side of the current confinement region where a first portion of the slab section has been removed and a second insulator region on a second side, of the current confinement region where a second portion of the slab section has been removed, and wherein the second side is opposite to the first side of the current confinement region.

7. The optical waveguide of claim 4, wherein the current confinement region is defined by a first oxidized region formed in the slab section on a first side of the current confinement region and a second oxidized region formed in the slab section on a second side of the current confinement region, wherein the second side is opposite to the first side of the current confinement region.

8. The optical waveguide of claim 1, wherein the optical waveguide comprises a Gallium Arsenide (GaAs) based optical waveguide, wherein the p-cladding layer comprises a GaAs-based cladding layer formed on a p-type GaAs substrate, and wherein the n-cladding layer is an n-type GaAs-based layer.

9. The optical waveguide of claim 1, wherein the optical waveguide comprises an Indium Phosphide (InP) based optical waveguide, wherein the p-cladding layer comprises a p-type InP substrate, and wherein the n-cladding layer is an n-type InP-based cladding layer.

10. A method, comprising:
transmitting an optical signal in a first direction in a waveguide comprising a rib section disposed on and a slab section;
changing a first optical mode of the optical signal in a first cross-sectional segment of the waveguide to a second optical mode in a second cross-sectional segment of the waveguide, wherein the first cross-sectional segment and the second cross-sectional segment are defined in different parallel planes perpendicular to the first direction, wherein a width of the rib section is different in the first cross-sectional segment from the second cross-sectional segment, wherein the width is defined in a second direction perpendicular to the first direction, and the rib section projects from the slab section in a third direction perpendicular to the first direction and the second direction; and
confining current to a current confinement region of the slab section that extends contiguously from the rib section to an active region in the slab section, wherein the current confinement region has a confinement width that is greater than the width of the rib section.

11. The method of claim 10, wherein the width of the rib section is smaller in the first cross-sectional segment than in the second cross-sectional segment and the first optical mode is smaller than the second optical mode.

12. The method of claim 10, wherein the width of the rib section is smaller in the first cross-sectional segment than in the second cross-sectional segment and the first optical mode is centered closer to the active region in the slab section than the second optical mode is centered to the active region.

13. The method of claim 10, wherein the confinement width is less than a width the slab section.

14. The method of claim 13, wherein the current confinement region is defined by a first proton implantation region on a first side of the current confinement region and a second proton implantation region on a second side, opposite to the first side, of the current confinement region.

15. The method of claim 13, wherein the current confinement region is defined by a first insulator region grown on a first side of the current confinement region where a first portion of the slab section has been removed and a second insulator region on a second side, opposite to the first side, of the current confinement region where a second portion of the slab section has been removed.

16. An optical waveguide, comprising:
a slab section including an active region configured to transmit optical signals in a first direction, the slab section further including a current confinement region; and
a rib section projecting from the slab section in a second direction perpendicular to the first direction, wherein the rib section has a smaller width than the slab section, and a width of the rib section tapers along the first direction,
wherein the current confinement region extends contiguously from the rib section to the active region, and
wherein the current confinement region has a confinement width that is greater than the width of the rib section.

17. The optical waveguide of claim 16, wherein the slab section and the rib section include at least two layers of a first material interleaved with at least two layers of a second material, wherein the first material and the second material have different indices of refraction.

18. The optical waveguide of claim 17, wherein a first layer of the first material of the at least two layers provides a first etch depth indication to a fabrication device, and wherein a second layer of the second material of the at least two layers provides a second etch depth indication to the fabrication device.

19. The optical waveguide of claim 17, wherein the confinement width is less than a slab width.

20. The optical waveguide of claim 19, wherein the current confinement region is defined by a first proton implantation region formed in the slab section on a first side of the current confinement region and a second proton implantation region formed in the slab section on a second side of the current confinement region, wherein the second side is opposite to the first side of the current confinement region.

* * * * *